United States Patent [19]
Dawson

[11] Patent Number: 6,133,628
[45] Date of Patent: Oct. 17, 2000

[54] METAL LAYER INTERCONNECTS WITH IMPROVED PERFORMANCE CHARACTERISTICS

[75] Inventor: Robert Dawson, Austin, Tex.

[73] Assignee: Advanced Micro Devices, Inc., Sunnyvale, Calif.

[21] Appl. No.: 08/993,061

[22] Filed: Dec. 18, 1997

[51] Int. Cl.[7] .................................................. H01L 23/04
[52] U.S. Cl. ........................ 257/698; 257/700; 257/758
[58] Field of Search ................................... 257/700, 691, 257/698, 758

[56] References Cited

U.S. PATENT DOCUMENTS

| | | | |
|---|---|---|---|
| 4,367,119 | 1/1983 | Logan et al. | |
| 5,309,024 | 5/1994 | Hirano | 257/691 |
| 5,710,462 | 1/1998 | Mizushima | 257/700 |
| 5,721,453 | 2/1998 | Imai et al. | 257/700 |
| 5,786,630 | 7/1998 | Bhansali et al. | 257/700 |
| 5,874,779 | 2/1999 | Matsuno | |

*Primary Examiner*—Sheila V. Clark

[57] ABSTRACT

Two patterned metal layers are interconnected by forming a through-hole in one or more insulating layers, employing an etch process minimizing the formation of polymeric residue, thereby maintaining an appropriate etch rate to penetrate the insulating material. A variety of fluorocarbon gas chemistries may be used, such as $CF_4$, $CH_3$, $CHF_3$ and $NF_3$. The through-hole is then filled with a conductive material, such as tungsten, to form a conductive via.

4 Claims, 3 Drawing Sheets

METAL LAYER INTERCONNECTS WITH IMPROVED PERFORMANCE CHARACTERISTICS

FIELD OF THE INVENTION

The present invention relates to semiconductor devices and, more specifically, to a method of interconnecting metal features spaced apart by multiple insulating layers.

BACKGROUND OF THE INVENTION

As contemporary semiconductor devices continue to decrease in size, the increase in density of patterned metal features can significantly affect device performance. Capacitance between patterned metal features in a semiconductor device, both on a single metal layer and between metal layers, can adversely affect the performance of the semiconductor device. Increasing the separation between patterned metal features can reduce the adverse effects of mutual capacitance. However, separating patterned metal features can increase metal line lengths, which tends to adversely affect device performance and nullify the benefits provided by separating the metal lines.

Metal interconnects between metal layers can have a significant impact on device performance. Since the size and location of metal interconnects affect both the electrical characteristics and the size of a circuit, special circumstances must be considered when designing and fabricating metal layer interconnects. Specifically, tolerances in the size and alignment of vias can make connecting two metal layers very difficult. In the context of semiconductor devices, a via is a filled through-hole that electrically connects two metal layers. Typical vias have a width of about 0.35 to about 0.5 microns, comparable to the widths of typical metal lines. Since the vias are about the same size as the electrically connected metal lines, the vias must be formed to contact a metal line exactly. If exact contact is not made, the metal interconnects can violate a minimum required spacing between metal lines specified by a particular set of design rules, and in extreme cases, cause a short between adjacent lines.

A conventional technique for electrically interconnecting metal features of separated patterned metal layers involves the use of landing pads or "borders." Landing pads are metal forms, e.g., square shaped, formed at locations at a metal level to enable connections to metal features on the same or lower metal levels. Landing pads are typically larger than their associated metal lines to ensure that a good electrical connection is made to the metal lines. Landing pads also provide better control over an etch process used to form vias by reducing the chance that the etch process will remove material beyond the landing pads.

Despite the benefits that landing pads provide, their relatively larger size can adversely affect device performance. First, landing pads can increase the density of metal layers since they are larger than metal lines. The separation between metal lines at locations of landing pads must be greater than locations with no landing pads since the landing pads extend beyond the metal lines. In addition, the relatively larger size of landing pads can adversely affect the electrical characteristics of a metal layer, by increasing the capacitance within a metal layer and between metal layers.

Another technique used in the formation of interconnects between metal layers involves the use of "borderless vias" or "non-nested vias" which provide electrical connections between metal layers without using landing pads. The use of borderless vias to connect metal layers avoids the undesirable characteristics associated with landing pads; however, it is very difficult to print these very small metal islands. For example, if the etched through-hole does not squarely hit the anti-reflective coating on top of a metal line, the resistance of the via rises dramatically.

Based on the performance considerations associated with metal interconnects and the limitations in the prior approaches for connecting metal layers in semiconductor devices, there is a need for an improved technique for electrically connecting metal layers.

SUMMARY OF THE INVENTION

An object of the present invention is a semiconductor device having metal layer interconnects with improved performance characteristics.

Another object of the present invention is a method of manufacturing a semiconductor device having metal layer interconnects and improved performance characteristics.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising a substrate, a first dielectric layer formed on the substrate, a first patterned metal layer on the first dielectric layer, a second dielectric layer on the first patterned metal layer, a second patterned metal layer on the second dielectric layer, a third dielectric layer on the second patterned metal layer, a third patterned metal layer on the third dielectric layer and a conductive via providing a direct electrical connection between the first and third patterned metal layers without a landing pad on the second patterned metal layer, wherein the conductive via comprises a through-hole formed in the second and third dielectric layers exposing the first patterned metal layer without exposing any metal in the second patterned metal layer, and conductive material filling the through-hole and forming a direct electrical connection between the first and third patterned metal layers.

According to another aspect of the invention, a semiconductor device comprises first and second conductive layers spaced apart by one or more insulating layers, a through-hole formed in the insulating layers exposing the first conductive layer, wherein the one or more insulating layers have a total thickness of about 2.8 to about 3.5 microns, and a conductive material filling the through-hole and electrically connecting the first and second conductive layers.

According to another aspect of the present invention, a method of manufacturing a semiconductor device includes, forming a first dielectric layer on a substrate, forming a first patterned metal layer on the first dielectric layer, forming a second dielectric layer on the first patterned metal layer, forming a second patterned metal layer on the second dielectric layer, forming a third dielectric layer on the second patterned metal layer, forming a through-hole extending through the second and third dielectric layers exposing the first patterned metal layer, filling the through-hole with conductive material to form a conductive via in electrical contact with the first patterned metal layer, and forming a third patterned metal layer on an electrical contact with the first patterned metal layers through the conductive via.

According to yet another aspect of the invention, a method of manufacturing a semiconductor device includes forming a first patterned conductive layer, forming one or more insulating layers having a total thickness of about 2.8 microns to about 3.5 microns on the first conductive layer, forming a through-hole through the one or more insulating layers exposing the first patterned metal layer, filling the through-hole with conductive material in contact with the first patterned conductive layer, and forming a second patterned conductive layer electrically connected to the first patterned conductive layer by the conductive material filling the through-hole.

Additional objects and advantages of the present invention will become readily apparent to those skilled in the art from the following detailed description, wherein only the preferred embodiment of the invention is shown and described, simply by way of illustration of the best mode contemplated for carrying out the invention. The invention is capable of the other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Embodiments of the invention are illustrated by way of example, and not by way of limitation, in the figures of the accompanying drawings in which like reference numerals refer to similar elements and in which.

DETAILED DESCRIPTION OF THE PREFERRED EMBODIMENT

The present invention enables direct electrical interconnection between patterned metal layers separated by one or more insulating layers. In general, a method for forming a connection between patterned metal layers in a semiconductor device, according to an embodiment of the invention, involves forming a through-hole in one or more layers of a semiconductor device to expose a first patterned metal layer. The through-hole is filled to form a via that is electrically connected to the first patterned metal layer. Then, a second patterned metal layer is formed on top of the one or more layers such that the via provides an electrical connection between the first and second patterned metal layers, without the use of metal landing pads. Minimizing the use of metal landing pads improves the performance characteristics of the semiconductor device by allowing the density of other patterned metal layers located between the first and second patterned metal layers to be increased, thereby allowing the size of the semiconductor device to be decreased. In addition, minimizing the use of landing pads reduces the adverse capacitance effects caused by landing pads, further improving the performance characteristics of the semiconductor device.

Figure 1:
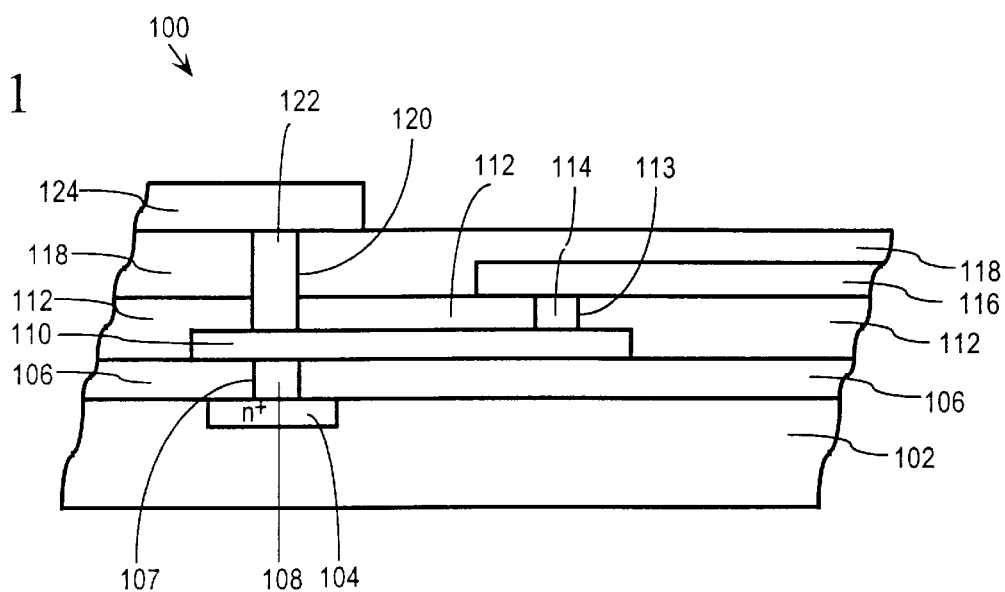
FIG. 1 schematically illustrates a semiconductor device with a connection between metal layers formed in accordance with an embodiment of the invention.

FIG. 1 schematically illustrates a semiconductor structure 100 made according to an embodiment of the invention. Semiconductor structure 100 comprises a substrate 102, typically silicon (Si), in which source/drain region 104 is formed. A dielectric layer 106, typically silicon dioxide ($SiO_2$), is formed on substrate 102 and source/drain region 104.

A through-hole 107 is formed in dielectric layer 106 and filled with conductive material, e.g. tungsten (W), plug to form a conductive via 108.

A metal layer 110, such as aluminum (Al) or an Al alloy, is formed on dielectric layer 106 and conductive via 108. Dielectric layer 106 insulates metal layer 110 from substrate 102.

A dielectric layer 112 is formed on metal layer 110 and dielectric layer 106, and is subsequently planarized. A through-hole 113 formed in dielectric layer 112 and filled with a conductive material, e.g. W, which is also planarized, typically by chemical mechanical polish (CMP), to form a conductive via 114.

A metal layer 116, e.g. Al, is formed on top of dielectric layer 112 and conductive via 114. Dielectric layer 112 electrically insulates metal layer 110 from metal layer 116. However, conductive via 114 provides an electrical connection between metal layer 116 and metal layer 110. A dielectric layer 118 is formed on metal layer 116 and dielectric layer 112.

A through-hole 120 is formed through both dielectric layer 118 and dielectric layer 112 to expose metal layer 110. Through-hole 120 is filled with a conductive material, e.g. W, to form a conductive via 122 that is electrically connected to metal layer 110. A metal layer 124 is formed on dielectric 118 and conductive via 122. Conductive via 122 provides an electrical connection between metal layer 124 and metal layer 110.

In conventional semiconductor devices, dielectric interlayers have a thickness of about 0.8 to about 1.2 microns, while metal layers have a thickness of about 0.8 to about 1.0 micron. Thus, conventional interlayer connections (conductive vias) that connect two adjacent metal layers, separated by a single dielectric layer, have a depth of about 1.0 to 1.2 microns. However, conductive via 122 connects metal layer 124 and metal layer 110 through dielectric layer 118 and dielectric layer 112. The thickness of dielectric layer 118, at the location where through-hole 120 is formed, is the equivalent thickness of a dielectric layer and a metal layer, accounting for metal layer 116. Thus, the total depth of through-hole 120, is equivalent to two dielectric layers and one metal layer, or about 2.8 to about 3.5 micron. The width of through-hole 120 is comparable to that of typical vias, or in the range of about 0.35 to about 0.5 microns. Hence, the aspect ratio of through-hole 122 is in the range of about five to about ten.

The processing steps involved in fabricating a semiconductor device having an interconnection between patterned metal layers according to an embodiment of the invention are now described with reference to FIGS. 2A–2E.

Figure 2A:
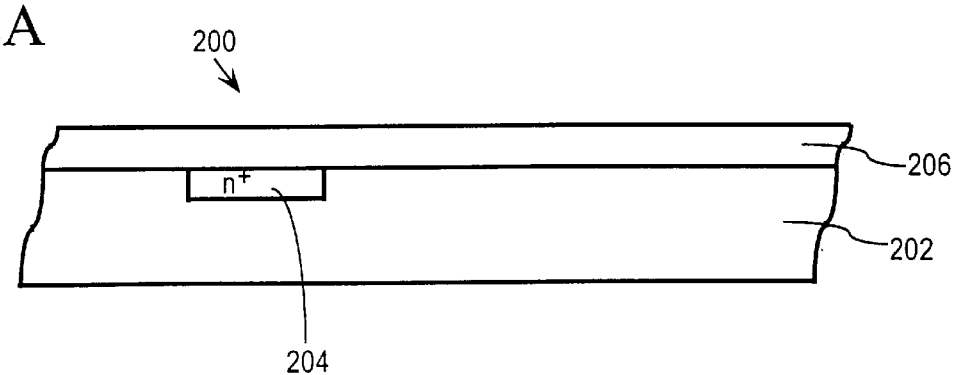
FIGS. 2A–2E illustrate relevant processing steps for manufacturing a semiconductor device with a connection between metal layers formed in accordance with an embodiment of the invention.

As illustrated in FIG. 2A, a semiconductor device 200 is formed with a substrate 202, made from a material such as silicon (Si), that includes a source/drain region 204. A dielectric layer 206, typically made from silicon dioxide ($SiO_2$), is formed on top of substrate 202 and source/drain region 204 using conventional deposition techniques, such as plasma enhanced chemical vapor deposition (PECVD) and/or chemical vapor deposition (CVD).

Figure 2B:
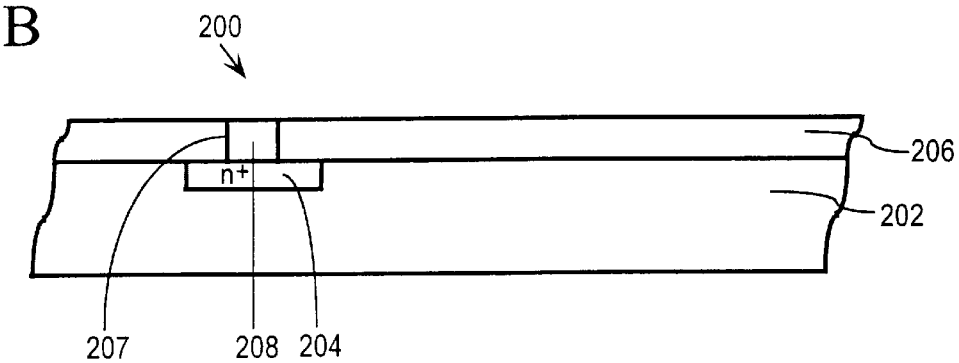

As illustrated in FIG. 2B, a through-hole 207 is formed in dielectric layer 206 and filled with a conductive material, e.g. a W plug, to form a conductive via 208.

Figure 2C:
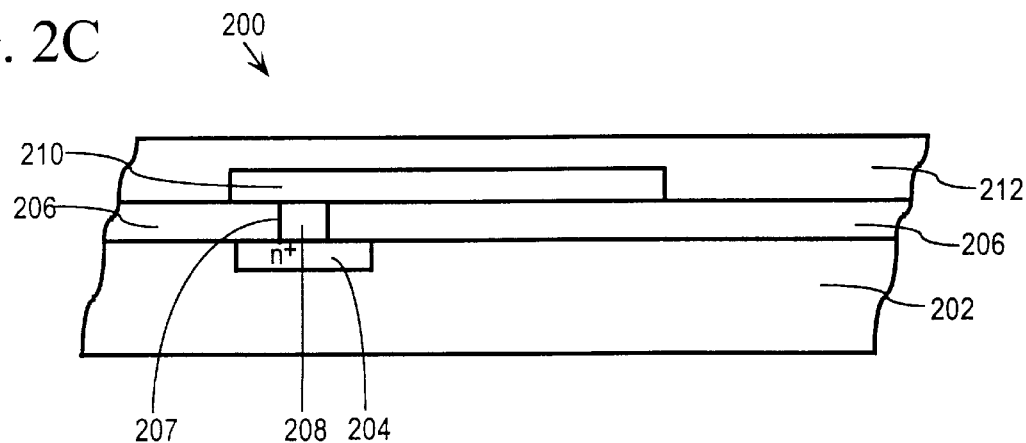

As illustrated in FIG. 2C, a metal layer 210, is formed on top of dielectric layer 206 and the conductive material forming via 208, using standard metal layer deposition techniques. Dielectric layer 206 electrically insulates metal layer 210 from substrate 202. A dielectric layer 212 is then formed on metal layer 210 and dielectric layer 206.

Figure 2D:
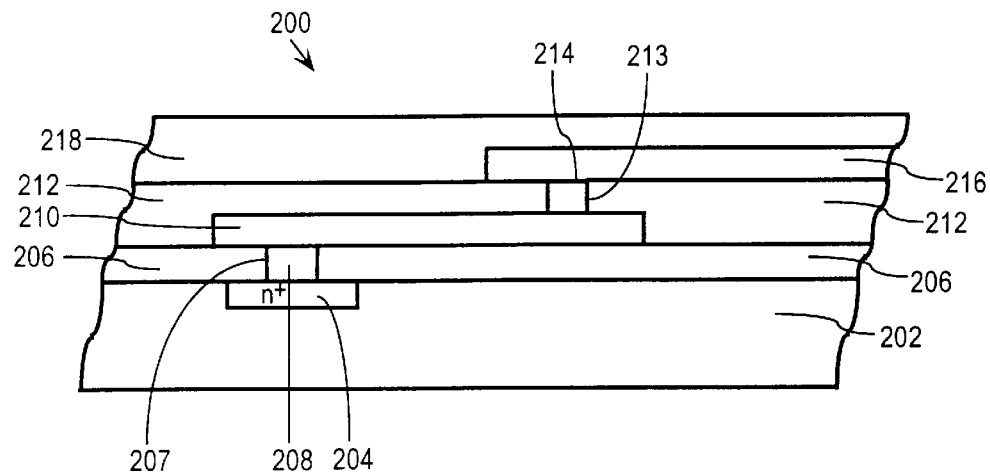

As illustrated in FIG. 2D, a through-hole 213 is formed in dielectric layer 212 and filled with a conductive material, e.g. W, to form a conductive via 214. Then, a metal layer 216, e.g. Al, is formed on dielectric layer 212 and conductive via 214. Conductive via 214 provides an electrical connection between metal layer 216 and metal layer 210, which are vertically adjacent. Dielectric layer 212 otherwise electrically insulates metal layer 210 from metal layer 216. A dielectric layer 218 is formed on metal layer 216 and dielectric layer 212.

Figure 2E:
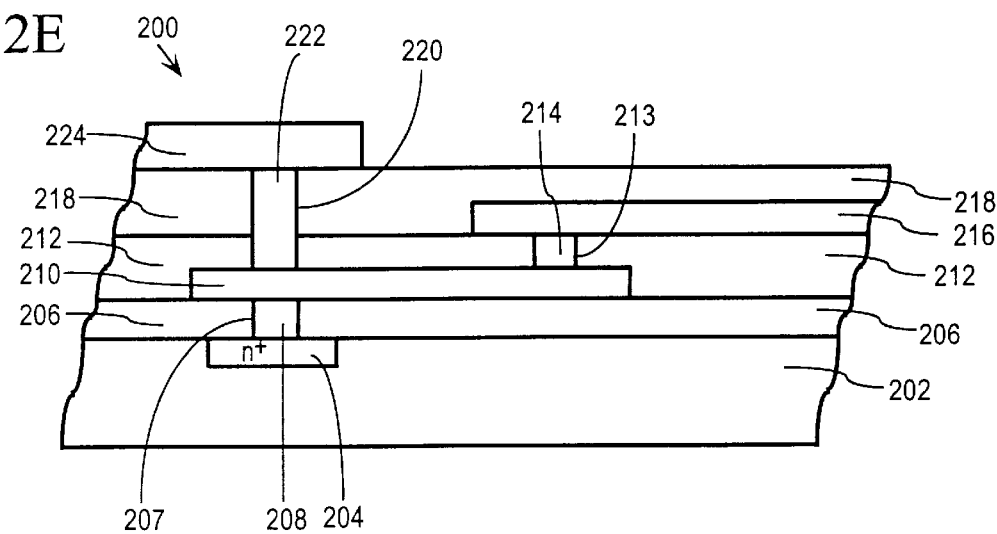

As illustrated in FIG. 2E, a through-hole 220 is formed in both dielectric layer 218 and dielectric layer 212 to expose metal layer 210. Through-hole 220 is filled with a conductive material, e.g. a W plug, to form a conductive via 222. A metal layer 224 is formed on top of dielectric layer 218 and conductive via 222. Conductive via 222 provides an electrical connection between metal layer 224 and metal layer 210.

Because of the depth of through-hole 220 (2.8 to 3.5 microns), ideally a low polymer deposition etch process is used to form through-hole 220 so that the etch process does not stop before through-hole 220 has been completely formed. A variety of fluorocarbon gas chemistries may be used such as $CF_4$, $CH_3$, $CHF_3$ and $NF_3$. Reducing the fluorine ratio or hydrogen present in the active species tends to reduce the amount of polymer deposited. The selected specific etch chemistry can be selected dependent upon the particular etch tool used to form through-hole 220. In an embodiment of the invention, an Applied Materials 5200 Centura tool is used with $C_4F_8$, $C_2F_6$ and argon chemistries. For the CVD TiN, the Applied Materials Centura is used running a TDMAT process.

According to an embodiment of the invention, an etch process that minimizes the formation of polymeric residue while maintaining a material removal rate in a range of about 3000 to about 8000 Angstroms/minute is employed to ensure that through-hole 220 is formed to the desired depth.

Although embodiments of the invention have been described in the context of forming a conductive via that extends through two dielectric layers, where one of the dielectric layers is equivalent in thickness to one dielectric layer and one metal layer, the conductive vias described herein may be formed in any number of layers between two conductive layers to be connected, up to a depth of approximately 3.5 microns.

The invention may be used with metal wires of any size, shape, or composition. For example, the invention may be used with wires that are less than 0.25 microns in size, wires that are irregularly shaped, or wires that are made from aluminum alloys or other materials.

The invention provides several advantages over prior approaches for interconnecting patterned metal layers in semiconductor devices. Connecting patterned metal layers in a semiconductor device in accordance the invention avoids the use of metal landing pads. This allows the density of metal layers between the patterned metal layers to be increased, which provides a smaller semiconductor device and reduces the adverse capacitance effects caused by landing pads. In addition, vertical interconnects formed without landing pads have lower resistance than vertical interconnects that use landing pads.

In the previous description, specific details have been set forth, such as specific materials, structures, chemicals, processes, etc., in order to provide a thorough understanding of the invention. However, it will be apparent that the invention may be practiced without these specific details. In other instances, well-known processing structures have not been described in detail in order to avoid unnecessarily obscuring the invention.

In addition, although the invention has been described with reference to specific embodiments thereof, it will be evident that various modifications and changes may be made thereto without departing from the broader spirit and scope of the invention. The specification and drawings are, accordingly, to be regarded in an illustrative rather than a restrictive sense.

What is claimed is:

1. A semiconductor device comprising:

a substrate;

a first dielectric layer formed on the substrate;

a first patterned metal layer on the first dielectric layer;

a second dielectric layer on the first patterned metal layer;

a second patterned metal layer on the second dielectric layer;

a third dielectric layer on the second patterned metal layer;

a third patterned metal layer on the third dielectric layer; and a conductive via providing a direct electrical connection between the first and third patterned metal layers without a landing pad on the second patterned metal layer, wherein the conductive via comprises:

a through-hole formed in both the second and third dielectric layers exposing the first patterned metal layer without exposing any metal of the second patterned metal layer; and a conductive plug filling the through-hole and forming a direct electrical connection between the first and third patterned metal layers; and the combined thickness of the second and third dielectric layers at the through-hole is from about 2.8 to about 3.5 microns.

2. The semiconductor device according to claim 1, wherein the aspect ratio of the through-hole is about 5.0 to about 10.0.

3. A semiconductor device comprising:

first and second conductive layers spaced apart by one or more insulating layers;

a through-hole having an aspect ratio of about 5.0 to about 10.0 formed in the insulating layers exposing the first conductive layer, wherein the one or more insulating layers have a total thickness of about 2.8 to about 3.5 microns; and a conductive material filling the through-hole and electrically interconnecting the first and second conductive layers.

4. The semiconductor device according to claim 3, wherein the one or more insulating layers have a total thickness of at least about 3.5 microns.

* * * * *